US007208826B2

(12) United States Patent
Sakamoto et al.

(10) Patent No.: US 7,208,826 B2
(45) Date of Patent: Apr. 24, 2007

(54) SEMICONDUCTOR DEVICE AND METHOD OF MANUFACTURING THE SAME

(75) Inventors: Noriaki Sakamoto, Gunma (JP); Isao Ochiai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 347 days.

(21) Appl. No.: 09/821,361

(22) Filed: Mar. 29, 2001

(65) Prior Publication Data
US 2002/0005576 A1 Jan. 17, 2002

(30) Foreign Application Priority Data
Jul. 5, 2000 (JP) .................... P2000-203395

(51) Int. Cl.
H01L 23/24 (2006.01)
H01L 23/22 (2006.01)

(52) U.S. Cl. .............. 257/687; 257/723; 257/724; 257/666; 257/667; 438/107; 438/125; 438/126; 437/209; 437/211

(58) Field of Classification Search ............ 257/666, 257/685–710, 723, 724, 771–787, E23.046, 257/E23.052, E23.124, E25.011, 667; 437/209, 437/211; 438/107, 125, 126
See application file for complete search history.

(56) References Cited

U.S. PATENT DOCUMENTS

| 4,264,917 | A | * | 4/1981 | Ugon | 257/668 |
| 5,096,852 | A | * | 3/1992 | Hobson | 29/827 |
| 5,273,938 | A | * | 12/1993 | Lin et al. | 438/107 |
| 5,349,233 | A | * | 9/1994 | Sasaki | 257/666 |
| 5,352,632 | A | * | 10/1994 | Sawaya | 29/827 |
| 5,900,676 | A | * | 5/1999 | Kweon et al. | 257/787 |
| 6,001,671 | A | * | 12/1999 | Fjelstad | 438/112 |
| 6,005,778 | A | * | 12/1999 | Spielberger et al. | 361/770 |
| 6,014,586 | A | * | 1/2000 | Weinberg et al. | 607/36 |
| 6,133,629 | A | * | 10/2000 | Han et al. | 257/698 |
| 6,198,171 | B1 | * | 3/2001 | Huang et al. | 257/787 |
| 6,246,115 | B1 | * | 6/2001 | Tang et al. | 257/706 |
| 6,798,049 | B1 | * | 9/2004 | Shin et al. | 257/678 |

FOREIGN PATENT DOCUMENTS

| JP | 03094430 A | * | 4/1991 |
| JP | 03169062 A | * | 7/1991 |
| JP | 05013611 A | * | 1/1993 |
| JP | 11204720 A | * | 7/1999 |

* cited by examiner

Primary Examiner—Richard Booth
Assistant Examiner—Chris C. Chu
(74) Attorney, Agent, or Firm—Fish & Richardson P.C.

(57) ABSTRACT

Die pads 50, 51, an external connecting electrode 52 and a bridge are covered with an insulating resin after half-etching, formed into a single package without a coupling member such as a supporting lead or adhesive tape. In addition, since no supporting board is required, a low-profile semiconductor device with improved heat radiation can be provided.

3 Claims, 13 Drawing Sheets

SEMICONDUCTOR DEVICE AND METHOD OF MANUFACTURING THE SAME

BACKGROUND OF THE INVENTION

1. Field of the Invention

This invention relates to a semiconductor device and a method of manufacturing it, and more particularly to a semiconductor device in which a plurality of semiconductor chips are mounted a planar or superposed manner and a method of manufacturing it.

2. Description of the Related Art

In recent years, in order to increase the capacity of a memory and also extend the circuit function, a plurality of chips are mounted in a single package.

For example, as shown in FIG. 12, a semiconductor device 3 with two semiconductor chips 1 and 2 arranged two-dimensionally is mounted in a single package. The semiconductor device 3 is formed in a lead frame in which a large number of leads 6 are arranged around a first die pad 4 and a second die pad 5. Bridges 7 are arranged between the first die pad 4 and the second die pad 5. The first semiconductor chip 1 is fixed onto the first die pad 4, whereas the second semiconductor chip 2 is fixed onto the second die pad 5. The first bonding pads 8 and 8a on the first and second chips 1 and 2 and the second bonding pads 9 on the leads 6 are connected to each other by metallic wires 10, respectively. The first semiconductor chip 1 and the second semiconductor chip 2 are electrically connected to each other by the bridges 7. The bonding pads 8 of the first semiconductor chip 1 and the bridges 7 are connected to each other by the metallic wires, respectively. Likewise the bridges 7 and the bonding pad 8a on the second semiconductor chip 2 are connected to each other by the metallic wires 10. The entire semiconductor device is mounted in a single package by insulating resin.

Each metallic wire 10 is connected so that its one end is subjected to ball bonding whereas its other end is subjected to stitch bonding. Since the stitch bonding during which ultrasonic wave is applied for a long time deteriorates the semiconductor chip, the ball bonding is adopted on the side of the semiconductor chip, whereas the stitch bonding is adopted on the side of the bonding pad on the lead 6.

However, where the first semiconductor chip 1 and the second semiconductor chip 2 are directly connected to each other by the metallic wires 10, either one of them must be necessarily connected by the stitch bonding. In order to obviate such an inconvenience, in this configuration, the bridges 7 are used to connect both semiconductor chips by the ball bonding.

However, with respect to the lead frame as shown in FIG. 12, the leads 6, which are coupled via a tie bar, can be easily handled. However, the bridges 7, each of which is formed in an island shape, will drop when it stands now. In order to prevent this, various schemes are proposed.

Now, a coupling piece 12 is formed for coupling the first die pad 4 and second die pad 5 with each other. The coupling piece 12 and the bridges 7 are bonded to each other by an adhesive tape.

However, the adhesive tape 13, to which heat is applied during molding, is required to have heat resistance and hence expensive. This leads to cost up of the semiconductor device.

Another technique for supporting the bridges 7 so that they will not drop is to form a lead pattern inclusive of the bridges 7 on a supporting board such as a flexible sheet, a ceramic board and a printed board and mold it. However, adoption of the supporting board increases the thickness of the semiconductor device, and so leads to cost up thereof. Further, the semiconductor chip molded on the supporting board is thermally insulated by the supporting board. This leads to temperature rise of the semiconductor chip. The temperature rise of the semiconductor chip gives rise to reduction of the driving current and driving frequency. This makes it impossible to bring out the inherent capability of the semiconductor chip.

SUMMARY OF THE INVENTION

This invention has been accomplished in view of the problem described above. Firstly, this invention solves the problems by a semiconductor device comprising:

a first and a second semiconductor chip which are electrically connected to each other;

a bridge arranged between the first and the second semiconductor chip and electrically connecting them;

external connecting electrodes provided to surround areas where the first and the second semiconductor chip are located, at least a portion of the rear surface of them serving as an electrode to be externally connected;

first metallic wires which electrically connect the first and the second semiconductor chip to the external connecting electrodes, respectively;

second metallic wires which electrically connect the first and the second semiconductor chip to the bridge; and insulating resin which seals the first and the second semiconductor chip, the external connecting electrode, and the first and the second metallic wires, wherein the insulating resin exposes the rear surface of each of the bridge and the external connecting electrodes, and the second metallic wires are ball-bonded on the first and the second semiconductor chip and stitch-bonded on the bridge.

As understood from the method of manufacturing a semiconductor as described later, since the bridge and external connecting electrodes are supported by the insulating resin, unlike the prior art, no adhesive tape is required. In addition, since the rear surface of the semiconductor chip is directly mounted a mounting board, a temperature rise in the semiconductor chip can be prevented.

Secondly, since the rear surface of each of the insulating resin and the bridge is coated with an insulating film, the wirings on the mounting board can be extended to the rear surface of the bridge, thereby simplifying the wiring pattern on the side of the mounting board.

Thirdly, since each of the insulating resin, the bridge and the external connecting electrodes is coated with an insulating film, and the external connecting electrodes are partially exposed, these connecting electrodes can be connected to the electrodes of the side of the mounting board.

Fourthly, this invention solves the above problem by a method of manufacturing a semiconductor device comprising the steps of:

preparing a sheet-like plate having a prescribed thickness, the plate having a flat rear surface over an entire region corresponding to a resin sealing area and a front surface in which external connecting electrodes and a bridge are formed as convex shapes in a region encircled by a region in contact with an upper mold;

mounting a semiconductor chip on an area where it is to be mounted and electrically connecting the semiconductor chip to the external electrodes and the bridge, respectively;

mounting the plate in a mold and filling a space formed by the plate and the upper mold with insulating resin; and removing the plate exposed to the rear surface of the insulating resin, thereby separating the convex portions.

Until the steps of mounting the semiconductor chips, electric connection and filling the insulating resin, the plate constituting connecting electrodes and bridge is used as a supporting board. Separation of the external connecting electrodes and bridge is performed using hardened insulating resin as a supporting board. Therefore, the supporting board such as a printed board, ceramic board which were conventionally adopted is not required. The bridge can also be made without using the adhesive tape.

DESCRIPTION OF THE PREFERRED EMBODIMENTS

Embodiment 1 explaining the semiconductor device according to the invention.

Figure 1A:
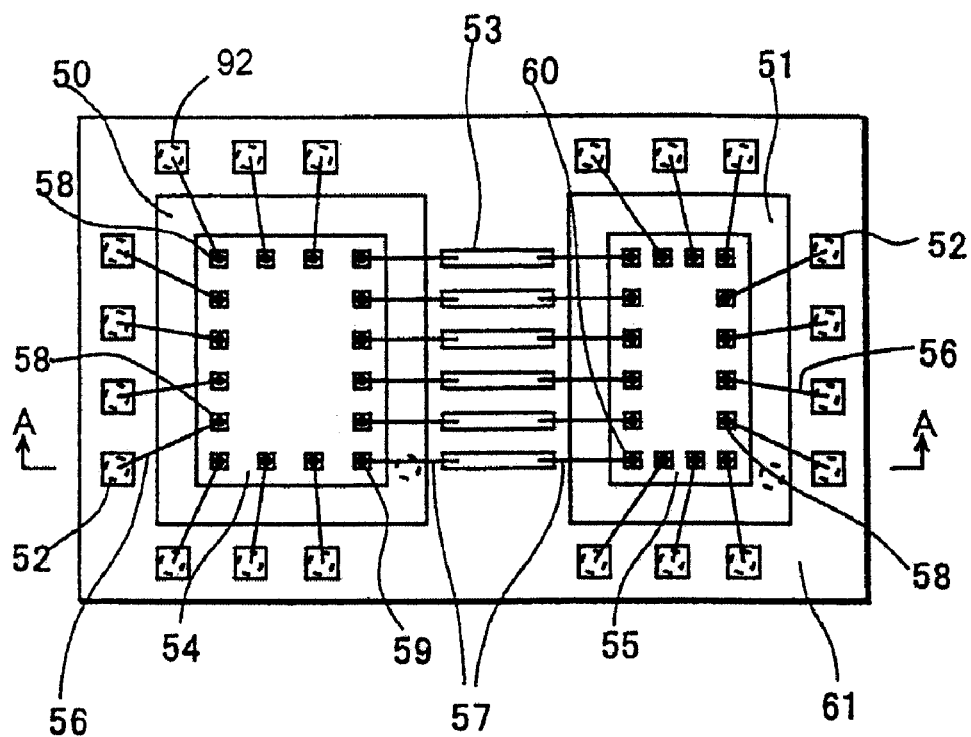
FIGS. 1A–F show a semiconductor device according to this invention.

FIG. 1A is a plan view of a semiconductor device according to the invention. FIGS. 1B–1E are sectional views taken in line A—A in FIG. 1A. FIGS. 1B–1E show four types of the rear-surface structure of the semiconductor device.

In this invention, a first die pad 50 and a second die pad 51 are arranged on substantially the same plane, and external connecting electrodes 52 are formed around them. The front surface of each of the connecting electrodes 52 serves as a bonding pad whereas the rear surface thereof is externally connected. At least one bridge 53 is formed between the first die pad 50 and the second die pad 51.

A first semiconductor chip 54 is fixed onto the first die pad 50, whereas a second semiconductor chip 55 is fixed onto the second die pad 51. These semiconductor chips 54 and 55 are connected to each other by metallic wires.

The metallic wires include a first metallic wire 56 connected to the external connecting electrode 52 and a second metallic wire 57 connected to the bridge 53. A plurality of bonding pads are formed on the surface of each semiconductor chip. On the basis of input signal to the bonding pads, at least a part of the bonding pads are selected. The positions and number of the external connecting electrodes are correspondingly determined. The selected bonding pads 58 on the semiconductor chip and the external connecting electrodes 52 are connected to each other by means of the first metallic wires 56.

On the other hand, the first semiconductor chip 54 and the second semiconductor chip 55 are connected in such a manner that a bonding pad 59 of the former and the one end of the bridge 53 are connected to each other by the second metallic wire 57 and the other end of the bridge 53 and a bonding pad 60 of the second semiconductor chip 55 are connected to each other by the second metallic wire 57.

In this configuration described above in which the bridge 53 is provided, all the metallic wires 56, 57 on the side of each of the first and second semiconductor chips 54, 55 are made connectable by ball bonding.

As understood from the description of FIGS. 7–11, the external connecting electrode 52 and bridge 53 are supported in such a manner that the conductive foil is half-etched and they are molded and supported by insulating resin 61 before they are completely separated.

The feature of this invention resides in that the external connecting electrodes 52 and the bridge 53 are not supported by a coupling piece such as a supporting lead and tab suspending lead, but are independently sealed by insulating resin 61. In addition, the feature resides in that these independent external connecting electrodes 52 and bridge(s) 53 are sealed without using the adhesive tape. Therefore, the completed product of the semiconductor device has no cutting portion of the above coupling piece.

Figure 12:
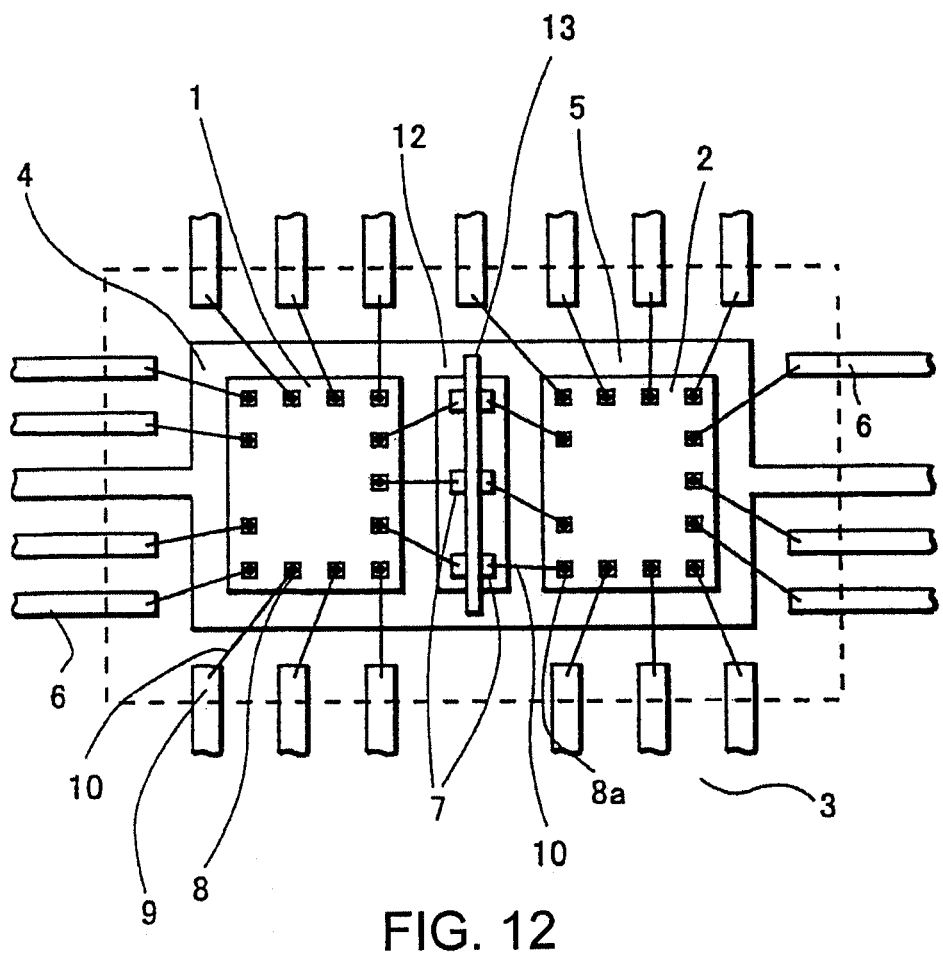
FIG. 12 is a view showing the semiconductor device using a conventional lead frame.

A conventional lead frame has been completed by cutting the coupling member such as a suspending lead and a tie bar. Namely, the lead is machined as a completed product from the front surface to the side and rear surfaces thereof. The lead from which is a completed product requires a coupling member. After the semiconductor chip is mounted on the lead frame, it is sealed by insulating resin, and the coupling member is cut. Therefore, the bridge 7 arranged in the form of an island without being connected to anywhere must be fixed by the supporting member such as the adhesive tape as shown in FIG. 12.

On the other hand, in accordance with this invention, on the side of a lead frame manufacturer, the conductive foil is half-etched, and the external connecting electrodes 52 and bridge(s) 53 are supplied, in a semi-completed state, to a semiconductor manufacturer. On the side of the semiconductor manufacturer, the semiconductor device is subjected to the packaging, electric connection and sealing by insulating resin. Finally, the rear surface of the external connecting electrode 52 and bridge(s) 53 is machined. Therefore, the semiconductor device can be completed without adopting the coupling member such as the tab suspending lead and adhesive tape, and with no mechanical separation of the coupling member.

Figure 1B:
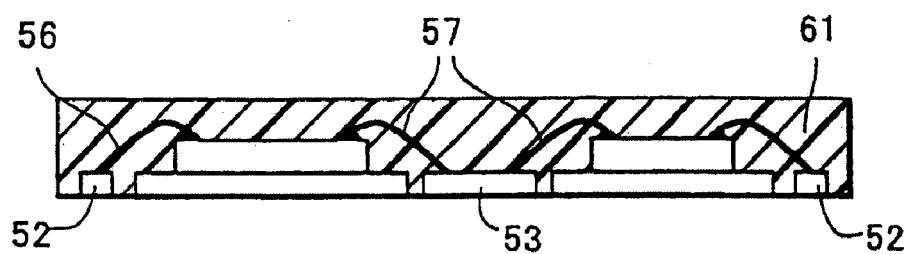

The rear surface of the insulating resin 61 is exposed in its shaded areas in FIG. 1A. This state is shown in FIG. 1B. The semiconductor device is secured on a mounting board at the electrodes formed on the mounting board to correspond to the above exposed areas. In this case, the heat generated from the semiconductor chips 54, 55 radiated toward the electrodes on the mounting board through the die pads 50, 51 having excellent thermal conductivity. The conventional semiconductor, in which the entire area is packaged or only the solder ball is made of a thermally conductive member in SMD, exhibits poor heat radiating characteristic, and hence could not show the greatest capability of the semiconductor chip. In contrast, the semiconductor device according to this embodiment exhibits excellent heat radiating characteristic and can show the great capability of the semiconductor chip.

Figure 1C:
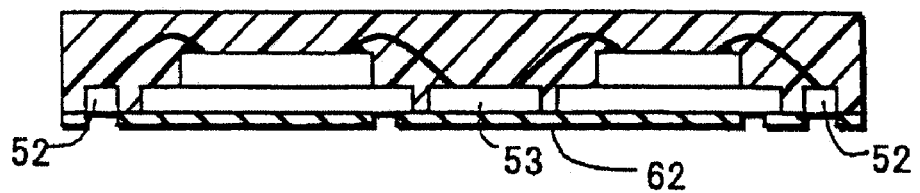

FIG. 1C shows a first modification of the above structure (FIG. 1B). In FIG. 1B, in which the shaded areas are exposed, it was difficult to extend the wirings on the mounting board to the rear surface of the semiconductor device. Further, when a brazing material is applied to the external connecting electrode 52 and die pads 50, 51, the thickness of the solder differs because of a difference in the areas so that the semiconductor device tilted.

This invention intends to solve the above problem by forming an insulating film 62 on the rear surface of the semiconductor device as shown in FIG. 1C. The dotted circles 92 shown in FIG. 1A show the external connecting electrodes 52, and die pads 50 and 51 exposed from the insulating film 62. In other words, since the other areas than the circle O marks 92 are covered with the insulating film 62, the wirings formed on the mounting board can be extended to the rear surface of the semiconductor device.

Since the areas of the O marks 92 are approximately equal to one another, the thickness of the brazing material does not substantially differ. This applies after solder printing or reflow, and also applies to the conductive paste such as Ag, Au, Ag—Pd.

Figure 1D:
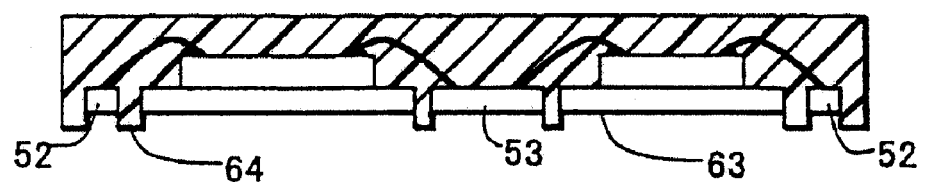

A second modification is shown in FIG. 1D. As seen from FIG. 1D, the rear surface of each of the die pads 50, 51 and the external connecting electrodes 52 is formed to be concave from that of the insulating resin 61. By adjusting the depth of these concave portions 63, the amount of the brazing material and conductive paste formed there can be controlled to adjust the bonding strength. Further, because of the presence of the convex portions 64 of the insulating resin 61, the solder or conductive paste will not be brought into contact with the rear surface of the semiconductor device. Incidentally, like the case of FIG. 1C, the rear surface of the semiconductor device is covered with the insulating resin 62 so that only the areas of the O marks 92 may be exposed.

Figure 1E:
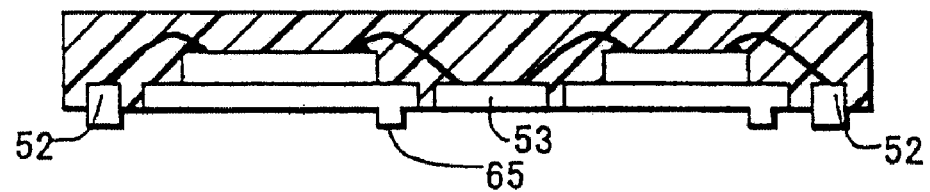
Figure 1F:
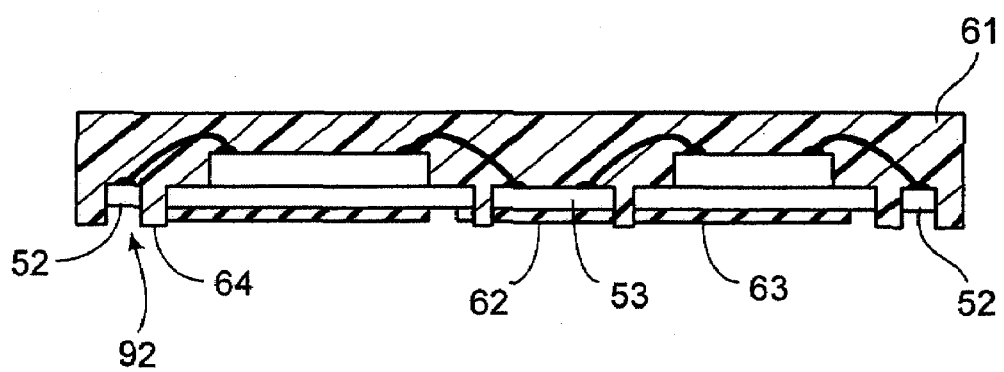

A third modification is shown in FIG. 1E. In this modification, oppositely to the case of FIG. 1D, convex portions 65 are provided. By adjusting the height of each of the convex portions, even if there is dust on the side of the mounting board, the semiconductor device can be preferably connected to the mounting board. For example, with respect to the semiconductor devices shown in FIGS. 1B and 1C, when there is dust between the semiconductor device and the mounting board, solder materials are not be fused with each other, which gives rise to poor soldering. The provision of the convex portions can solve this problem.

Embodiment 2 explaining the semiconductor device according to the invention.

Figure 2A:
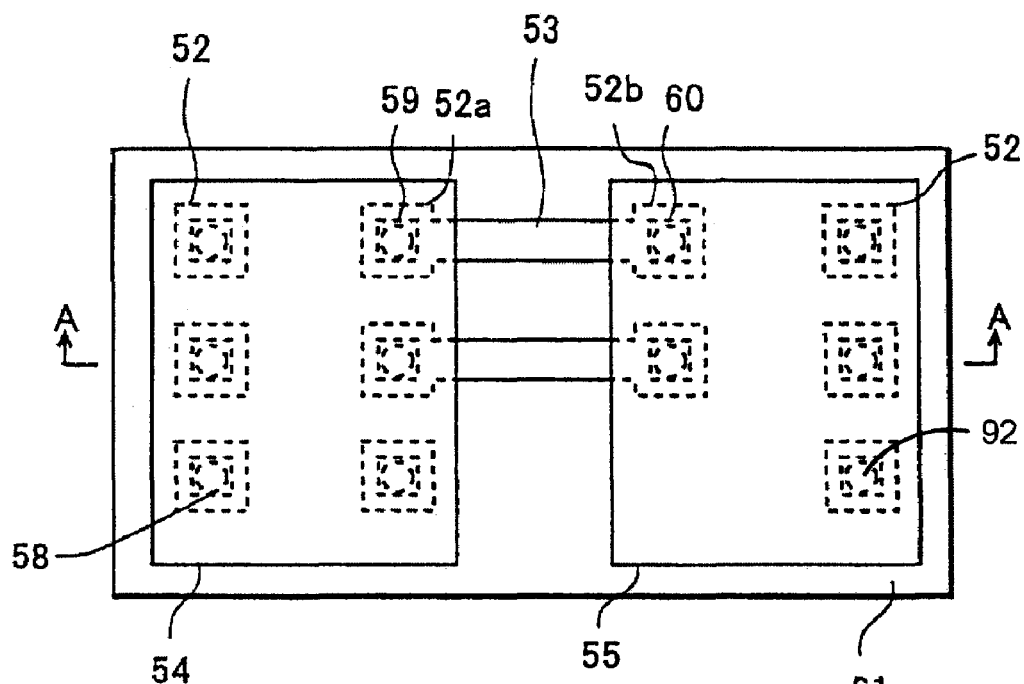
FIGS. 2A–E show a semiconductor device according to this invention.
Figure 2B:
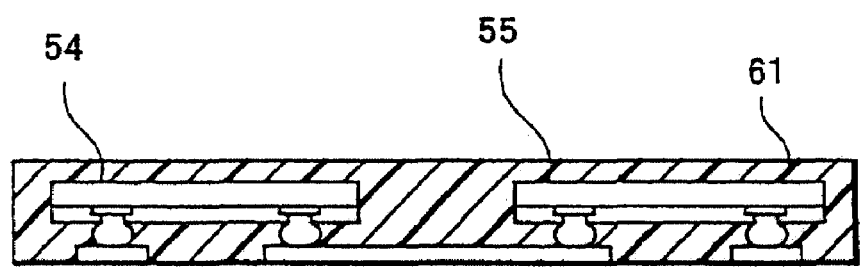
Figure 2C:
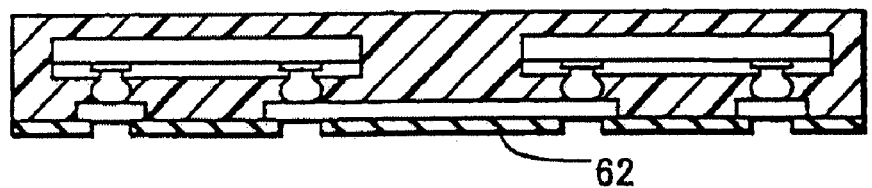
Figure 2D:
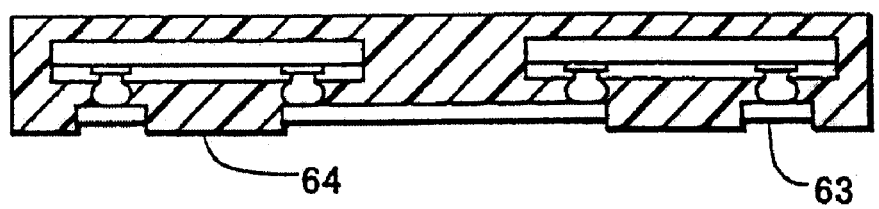
Figure 2E:
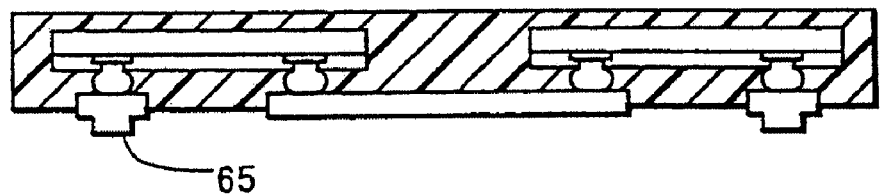

FIG. 2A is a plan view of a semiconductor device according to the invention. FIGS. 2B–2E are sectional views taken in line A—A in FIG. 2A. FIGS. 2B–2E show the rear-surface structures of the semiconductor device like the first embodiment.

The feature of this embodiment resides in that the semiconductor chips 54, 55 for face-down are adopted so that the external connecting electrodes 52 can be arranged immediately below the semiconductor chip, thereby reducing the planar area and thickness of the semiconductor device.

Each of the first semiconductor chip 54 and the second semiconductor chip 55 may be a bare chip, a flip-chip, SMD, a wafer scale CSP, etc. The external connecting electrodes 52 are formed at the positions corresponding to the electrodes on the semiconductor chips 54, 55. The external connecting electrodes 52 and electrodes of the semiconductor chips 54, 55 are connected to each other by connecting means. This connecting means may be an Au bump, brazing material, soldering ball, conductive ball, anisotropic conductive resin, etc.

The bridge(s) 53 is formed integrally to the external connecting electrodes 52a, 52b. It is extended from the bonding pad 59 of the first semiconductor chip 54 to the bonding pad 60 of the second semiconductor chip 55.

The semiconductor device, in which heat conducts only through the solder ball, exhibits poor heat radiating characteristic. However, by exposing the rear surface of the semiconductor chips 54, 55 from the insulating resin 61, or reducing the thickness of the insulating resin on the rear surface of the semiconductor chips 54, 55, the temperature rise in the semiconductor chips can be prevented. A heat radiating fin may be attached to the rear surface of the semiconductor chips.

Embodiment 3 of the semiconductor device according to the invention.

Figure 3A:
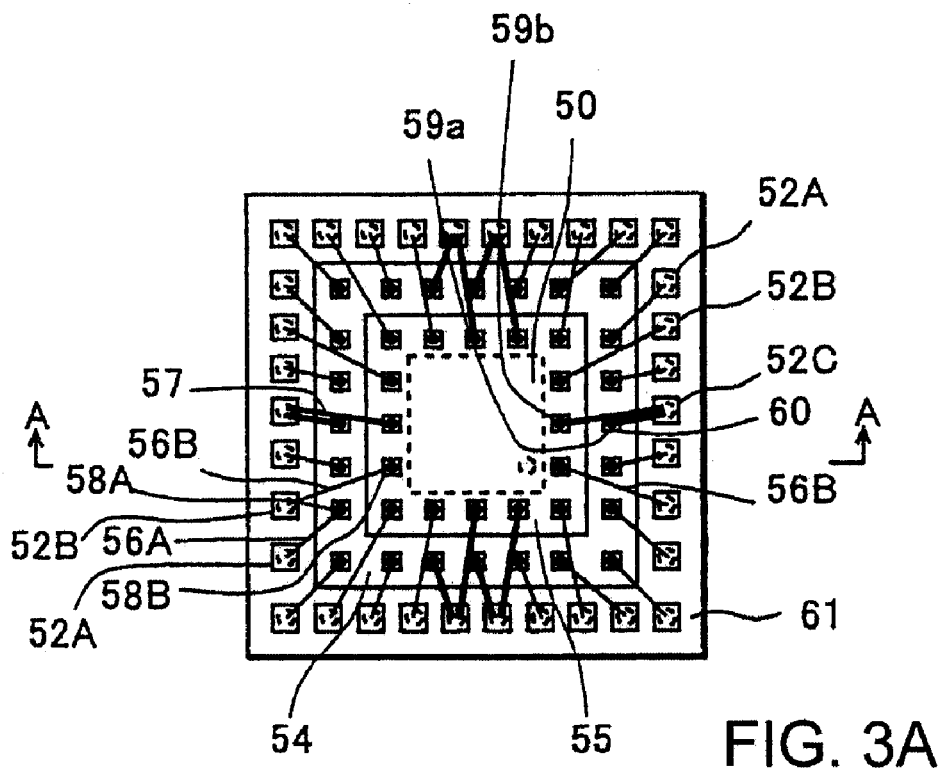
FIGS. 3A–E show a semiconductor device according to this invention.

FIG. 3A is a plan view of a semiconductor device according to the invention. FIGS. 3B–3E are sectional views taken in line A—A in FIG. 3A. FIGS. 3B–3E show four types of rear-surface structures of the semiconductor device like the above two embodiments.

In this embodiment, the semiconductor chip 55 is superposed on the first semiconductor chip 54. In this embodiment, although two semiconductor chips are stacked, three or more chips may be stacked. Further, since they are connected using metallic wires, they are stacked in such a manner that the upper semiconductor chip is formed to have a smaller size than the lower semiconductor chip, and around the upper semiconductor chip, the bonding pads of the lower semiconductor chip are exposed.

First of all, a die pad 50 is present and the external connecting electrodes 52 are provided around the die pad 50. The front surface of the external connecting electrode serves as a bonding pad, whereas the rear surface thereof is externally connected. The external connecting electrodes 52 include a bridge(s) 52C which connects a first semiconductor chip 54 and a second semiconductor chip 55. The desired number of bridge(s) is formed from the standpoint of the connection of these electrodes.

The first semiconductor chip 54 is fixed onto the die pad 50. The fixing means is selected according to whether the first semiconductor chip 54 is fixed at a prescribed potential or is floating. Specifically, where it is fixed at the prescribed potential, it is fixed using solder or conductive paste. Where it is floating, it is fixed using insulating adhesive. Further, the second semiconductor chip 55 is fixed onto the first semiconductor chip 54 using the insulating adhesive. The bonding pads 58A of the first semiconductor chip 54 are connected to the external connecting electrodes 52A by metallic wires 56A, whereas the bonding pads 58B of the second semiconductor chip 55 are connected to the external connecting electrodes 52B by the metallic wires 56B.

On the other hand, the first semiconductor chip 54 and the second semiconductor chip 55 are connected in such a manner that the bonding pad 59a of the former and the external connecting electrode 52C are connected by a metallic wire 60, whereas the external connecting electrode 52C and the bonding pad 59b of the second semiconductor chip 55 are connected by the metallic wire 60. Incidentally, the external connecting electrode 52C is connected to at least two metallic wires so that its size may be larger than that of the other connecting electrodes.

In this configuration described above in which the external connecting electrode 52C is provided, all the metallic wires on the side of each of the first and second semiconductor chips 54, 55 are made connectable by ball bonding.

As understood from the description of FIGS. 7–11, the external connecting electrode 52 are supported in such a manner that the conductive foil is half-etched and they are molded and supported by insulating resin 61 before they are completely separated.

The feature of this invention resides in that the external connecting electrodes 52 are not supported by a coupling piece such as a supporting lead and tab suspending lead, but are independently sealed by insulating resin 61. In addition, the feature resides in that these independent external connecting electrodes 52 are sealed without using the adhesive tape. Therefore, the completed product of the semiconductor device has no cutting portion of the above coupling piece.

A conventional lead frame has been completed by cutting the coupling member such as a suspending lead and a tie bar. Namely, the lead is machined as a completed product from the front surface to the side and rear surfaces thereof. The lead from which is a completed product requires a coupling member. After the semiconductor chip is mounted on the lead frame, it is sealed by insulating resin, and the coupling member is cut. Thus, the bridge arranged in the form of an island without being connected to anywhere must be fixed by the supporting member such as the adhesive tape.

On the other hand, in accordance with this invention, on the side of a lead frame manufacturer, the conductive foil is half-etched, and the external connecting electrodes 52 are supplied, in a semi-completed state, to a semiconductor manufacturer. On the side of the semiconductor manufacturer, the semiconductor device is subjected to the packaging, electric connection and sealing by insulating resin. Finally, the rear surfaces of the external connecting electrode 52 is treated such as to be divided over the whole surface thereof. Therefore, the semiconductor device can be completed without adopting the coupling member such as the tab suspending lead and adhesive tape, and with no mechanical separation of the coupling member.

Figure 3B:
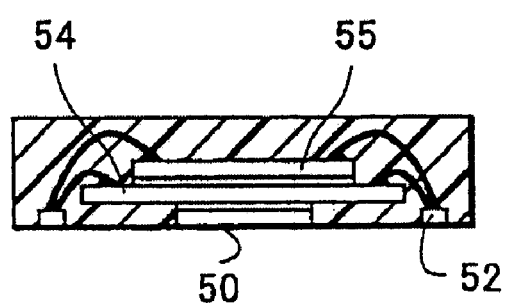

Onto the rear surface of the insulating resin 61, the die pad 50 and the external connecting electrodes 52 shown in FIG. 3A are exposed. This is shown in FIG. 3B. The semiconductor device is secured on a mounting board at the electrodes formed on the mounting board to correspond to the above exposed areas. In this case, the heat generated from the semiconductor chip radiated toward the electrodes on the mounting board through the die pad 50 having excellent thermal conductivity. The conventional semiconductor, in which the entire area is packaged or only the solder ball is made of a thermally conductive member in SMD, exhibits poor heat radiating characteristic, and hence could not show the greatest capability of the semiconductor chip. In contrast, the semiconductor device according to this embodiment exhibits excellent heat radiating characteristic and can show the great capability of the semiconductor chip.

Figure 3C:
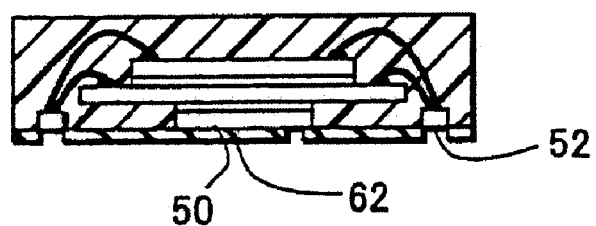

FIG. 3C shows a first modification of the above structure (FIG. 3B). In FIG. 3B, in which the shaded areas are exposed, it was difficult to extend the wirings on the mounting board to the rear surface of the semiconductor device. Further, when a brazing material is applied to the external connecting electrode 52 and die pad 50, the thickness of the solder differs because of a difference in the areas, thus giving rise to poor electrical connection.

This invention intends to solve the above problem by forming an insulating film 62 on the rear surface of the semiconductor device as shown in FIG. 3C. the dotted circles O 92 shown in FIG. 3A show the external connecting electrodes 52 and die pad 50 exposed from the insulating film 62. In other words, since the other areas than the circles O marks 92 are covered with the insulating film 62, the wirings formed on the mounting board can be extended to the rear surface of the semiconductor device. Since the areas of the O marks 92 are approximately equal to one another, the thickness of the brazing material does not substantially differ. This applies after solder printing or reflow, and also applies to the conductive paste such as Ag, Au, Ag—Pd.

Figure 3D:
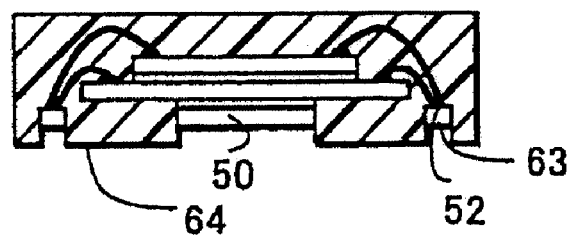

A second modification is shown in FIG. 3D. As seen from FIG. 3D, the rear surface of each of the die pads 50 and the external connecting electrodes 52 is formed to be concave from the that of the insulating resin 61. By adjusting the depth of these concave portions 63, the amount of the brazing material and conductive paste formed there can be controlled to adjust the bonding strength. Further, because of the presence of the convex portions 64 of the insulating resin 61, the solder or conductive paste will not be brought into contact with the rear surface of the semiconductor device. Incidentally, like the case of FIG. 3C, the rear surface of the semiconductor device is covered with the insulating resin 62 so that only the areas of the O marks 92 may be exposed.

Figure 3E:
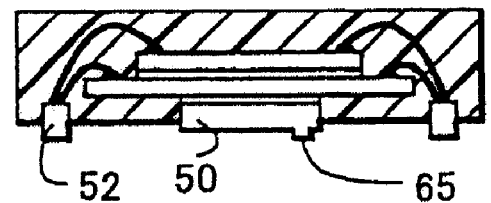
Figure 4A:
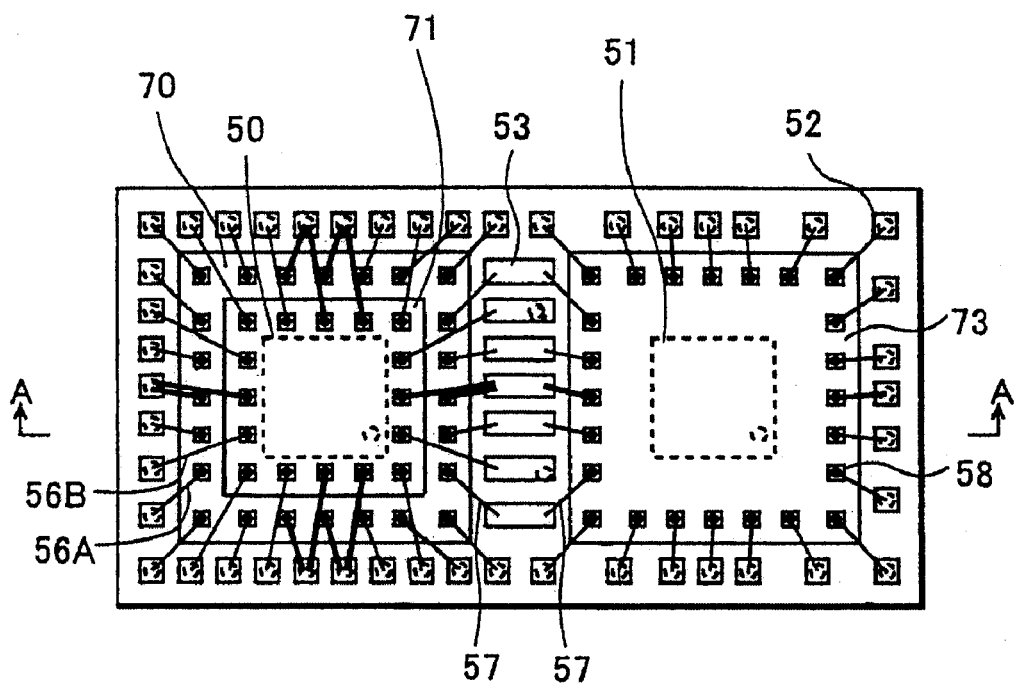
FIGS. 4A–E show a semiconductor device according to this invention.
Figure 4B:
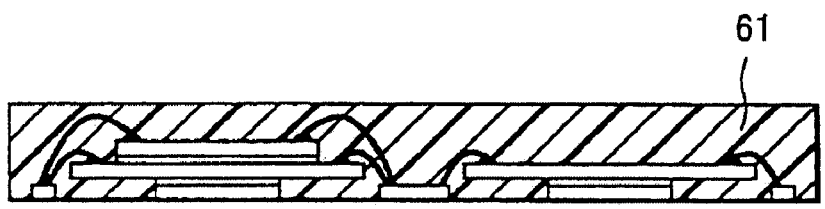
Figure 4C:
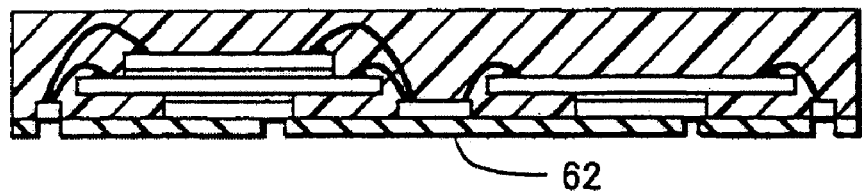
Figure 4D:
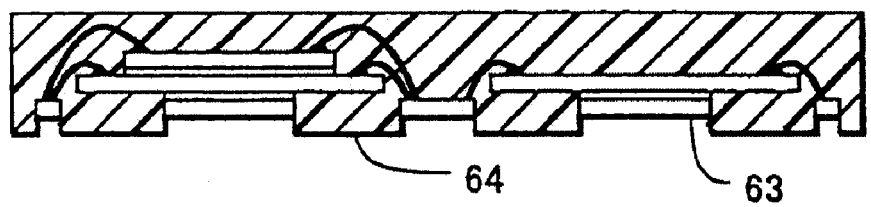
Figure 4E:
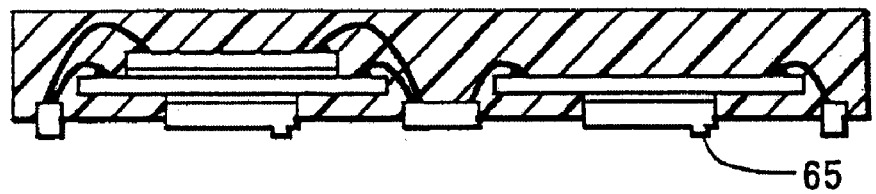

A third modification is shown in FIG. 3E. In this modification, oppositely to the case of FIG. 3D, convex portions 65 are provided. By adjusting the height of each of the convex portions, even if there is dust on the side of the mounting board, the semiconductor device can be preferably connected to the mounting board. For example, with respect to the semiconductor devices shown in FIGS. 3B and 3C, when there is dust between the semiconductor device and the mounting board, solder materials are not be fused with each other, which gives rise to poor soldering. The provision of the convex portions can solve this problem. This applies to the semiconductor device shown in FIG. 3D.

Embodiment 4 explaining the semiconductor device according to the invention.

This embodiment is shown in FIG. 4. FIG. 4 is a combination of FIGS. 1 and 3. On the first die pad 50, the semiconductor chips 70 and 71 are stacked like the structure shown in FIG. 3. Further, on the second die pad 51, a third semiconductor chip 73 is fixed. The first semiconductor chip 70, the second semiconductor chip 71 and the third semiconductor chip 73 are connected to one another through the external connecting electrodes 52 and bridge(s) 53 on the basis of a prescribed electric connection.

The detailed explanation has been made in connection with FIGS. 1 and 3 will not be given here.

Embodiment 5 explaining the semiconductor device according to the invention.

Figure 5:
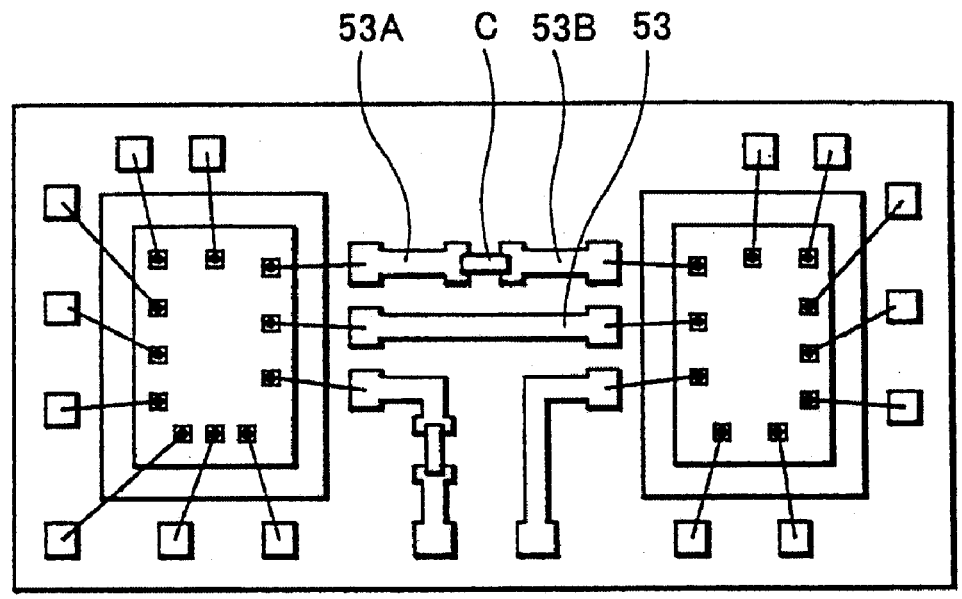
FIG. 5 is a view showing a semiconductor device according to this invention.

This embodiment is shown in FIG. 5. FIG. 5 shows a modification of FIG. 1 in which a circuit element is connected between a bridge 53A and a bridge 53B. Now, the circuit element is a chip capacitor C.

Embodiment 6 explaining the semiconductor device according to the invention

Figure 6:
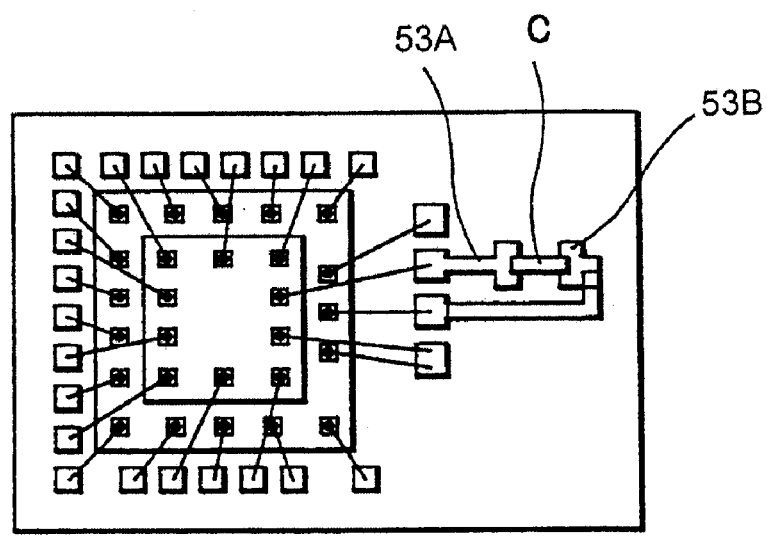
FIG. 6 is a view showing a semiconductor device according to this invention.

This embodiment is shown in FIG. 6. FIG. 6 shows a modification of FIG. 3 in which a circuit element, e.g. a chip capacitor C is connected between the two connecting electrodes.

Embodiment 7 explaining the method of manufacturing the semiconductor device

Referring to FIGS. 7 to 11, an explanation will be given of the method of manufacturing a semiconductor device 80 using a conductive foil mainly made of Cu.

Figure 7:
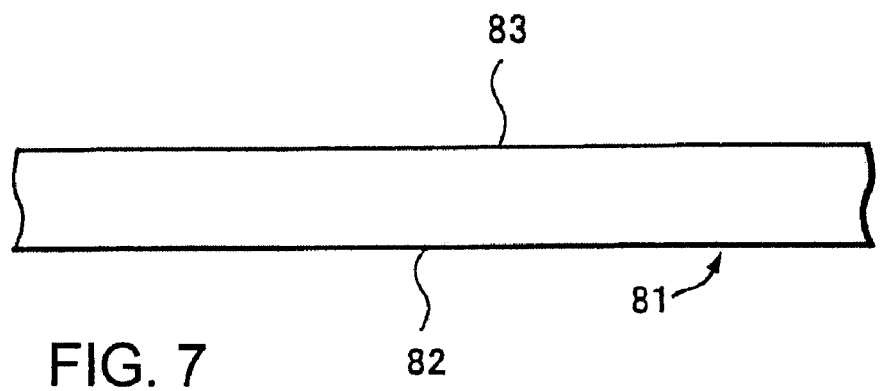
FIG. 7 is a view showing the method of manufacturing a semiconductor device according to this invention.
Figure 8:
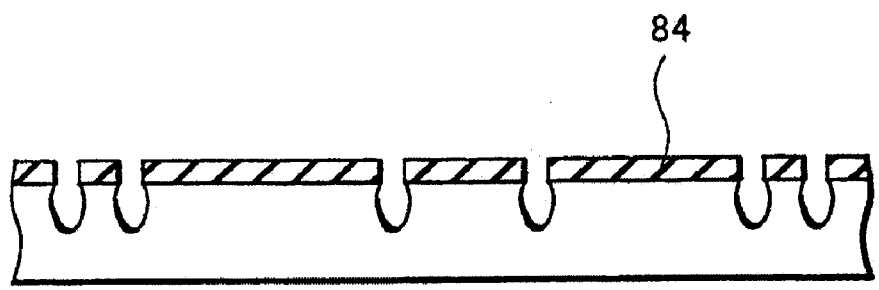
FIG. 8 is a view showing the method of manufacturing a semiconductor device according to this invention.
Figure 9:
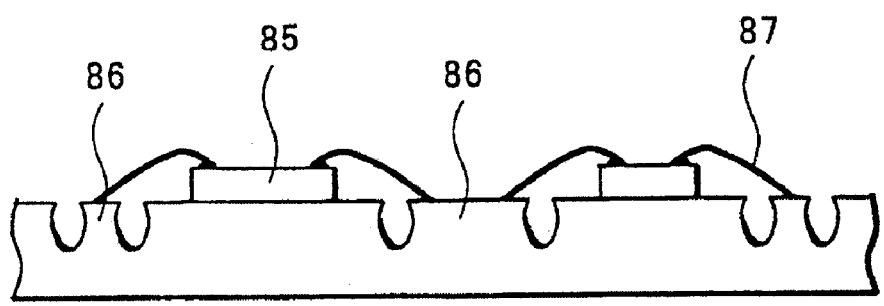
FIG. 9 is a view showing the method of manufacturing a semiconductor device according to this invention.
Figure 10:
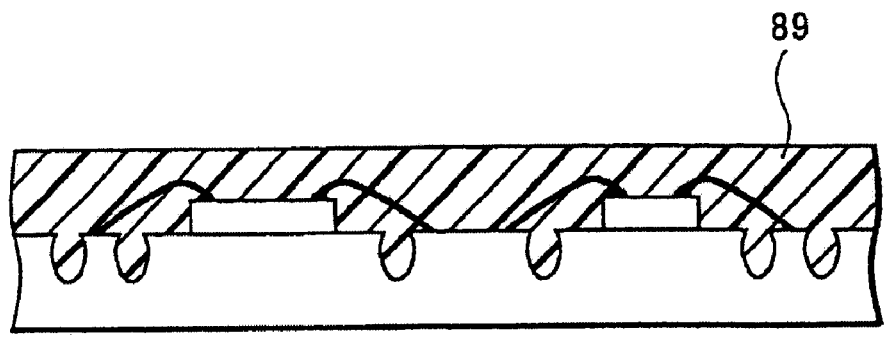
FIG. 10 is a view showing the method of manufacturing a semiconductor device according to this invention.
Figure 11:
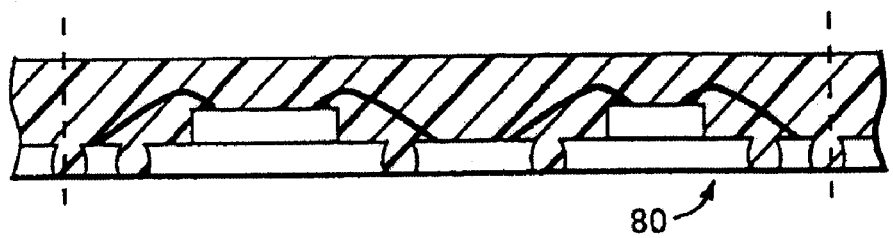
FIG. 11 is a view showing the method of manufacturing a semiconductor device according to this invention.

First, as seen from FIG. 7, a plate 81 made of a conductive foil is prepared. The plate 81 has a first surface 82 and second surface 83 which are flat. The second surface 83 is covered with a conductive film 84 or photoresist having a conductive pattern which corresponds to a hatched portion in FIG. 8. Incidentally, where the photoresist is adopted in place of the conductive film, the conductive film is formed below the photoresist at the portion corresponding to the bonding pad.

Next, the plate 81 is half-etched through the conductive film 84 or photoresist. The depth of etching may be shallower than the thickness of the plate 81. Incidentally, it should be noted that when the depth of etching is shallower, it is possible to form a finer pattern.

By half-etching, conductive patterns are formed in convex shapes on the second surface 83 of the plate 81. The plate 81 may be a laminated body of Cu—Al or Al—Cu—Al. Particularly, the laminated body of Al—Cu—Al can prevent warp resulting from the difference in their thermal expansion coefficient (see FIG. 8 hitherto).

Subsequently, semiconductor elements 85 are fixed onto corresponding areas of the plate. The bonding electrodes of each semiconductor element 85 are electrically connected to first pads 86. In the example as shown, since the semiconductor element 85 is mounted in a face-up form, metallic wired 87 are adopted as a connecting means.

In the above bonding step, since the first pads 86 are integral to the plate 81, and the rear surface of the plate 81 is flat, the plate is brought into contact in plane with a table for a bonding machine. When the plate 81 is completely secured to the bonding table, with no displacement of the first pads 86, bonding energy can be effectively conducted to the metallic wires 87 and first pads 86. Thus, the bonding strength of the metallic wires can be improved. The bonding table can be secured by forming a plurality of vacuum sucking holes on the entire surface of the table.

Where a face-down type of semiconductor element is adopted, the solder balls or bumps of Au or solder are formed for connection of its electrodes. With the electrodes on the semiconductor element 85 arranged immediately below which the corresponding first pads 86 are located, both are fixed to each other (see FIG. 2 as regards the details).

Passive elements may be bonded to the pads 86 through the brazing material such as solder and conductive paste such as Ag paste. The passive elements which can be now adopted are a chip resistor, a chip capacitor, a printed resistor, a coil, etc. (see FIG. 9 hitherto).

A layer of insulating resin 89 is formed to cover the conductive pattern, semiconductor element 85 and connecting means. The insulating resin may be either thermoplastic or thermosetting.

The layer of insulating resin 89 can be formed by the technique of transfer mold, injection mold, dipping or applying. Specifically, the thermosetting resin such as epoxy resin can be formed by the transfer mold, whereas the thermoplastic resin such as liquid-crystal polymer, polyphenylene sulfide, etc. can be formed by injection mold.

In this embodiment, the thickness of the insulating resin is adjusted so that the thickness of about 100 μm above the top of the metallic wire 87 is covered. This thickness can be increased or decreased in view of the strength of the semiconductor device.

Since the conductive patterns are formed integrally to the sheet-like plate 81, during the implantation, their displacement does not occur unless the displacement of the plate 81 does not occur. The rear surface of the plate 81 can be secured to a lower mold by vacuum sucking.

Thus, the conductive patterns formed as convex portions and semiconductor device are embedded in the insulating resin 89. The portion of the plate 81 lower than the convex portions is exposed on the rear surface (see FIG. 10 hitherto).

Subsequently, the plate 81 exposed to the rear surface of the insulating resin 89 is removed to separate the conductive patterns into individual segments.

The step of separation can be implemented by various techniques. The rear surface of the plate may be removed by etching, or by polishing or griding. Both may be adopted.

For example, when the plate is ground until the insulating resin 89 is exposed, the grinding residue of the plate 81 or metal of thin burr extended outwardly will encroach on the insulating resin 89. In order to obviate such inconvenience, cutting-down is stopped immediately before the insulating resin 89 is exposed. Thereafter, the conductive patterns are separated into individual segments by etching. In this case, the metal of the plate 81 does not encroach on the insulating resin between the individual patterns. Thus, short-circuiting between the conductive patterns arranged at minute intervals can be prevented.

Where a plurality of units each constituting a semiconductor device 80 are formed, after the step of separation, a step of dicing the entire resultant body into individual semiconductor devices 80 must be carried out.

In this embodiment, a dicing apparatus was used for the purpose of separation. This separation may be also carried out by chocolate break, pressing or cutting (see FIG. 11 hitherto).

Through the manufacturing process hitherto described, a miniaturized package can be realized by three components of a plurality of conductive patterns, semiconductor elements 85 and insulating resin 89.

An explanation will be given of the meritorious effects obtained by the manufacturing process described above.

First, since the conductive patterns, which are formed by the half-etching, are supported integrally to the plate, the board which was conventionally used as a supporting board is not required.

Secondly, since the plate can include conductive patterns which have becomes convex as a result of half-etching, the conductive patterns has been miniaturized. Therefore, the width of each conductive pattern and interval between the conductive patterns can be decreased, thereby manufacturing a package with a small planar size.

Thirdly, since the semiconductor device is constituted by the above three components, it can be constituted by a necessary and minimum number of components. Thus, a low-profiled semiconductor device can be manufactured for greatly reduced cost without using unnecessary material.

Fourthly, the die pad, external connecting electrode, bridge and wirings are formed as convex portions by half-etching. Since the separation into the individual chips is carried out after sealing, the tie bar or suspending leads are not necessary. Forming and cutting the tie bar is not required in this invention.

In addition, the bridge can be formed with no support by the adhesive tape.

Fifthly, after the conductive patterns formed as convex portions are embedded in the insulating resin, the plate is removed from the rear surface of the insulating resin to separate the lead into individual lead portions. Therefore, unlike the conventional lead frame, resin burr generated between the leads can be eliminated.

Sixthly, since the rear surface of each of the semiconductor elements is exposed from that of the insulating resin, the heat generated from the semiconductor device according to this invention can be discharged effectively from its rear surface.

As understood from the description hitherto made, this invention has a structure in which the conductive patterns can be formed by half-etching through the conductive film or photoresist. Further, the plate is not stamped out from the front to the rear by pressing or etching, but its stamping is stopped on the way so that it can be formed into conductive patterns of the external connecting electrodes and bridges. Because of the structure permitting the half-etching to be adopted, the interval between the conductive patterns can be decreased, thereby making more miniaturized patterns. Further, since the die pads, external connecting electrodes and bridges can be formed integrally to the plate, their deformation or warp can be suppressed, thereby making the tie bar and suspending lead unnecessary. Further, after the plate has been completely fixed by sealing the insulating resin, the conductive patterns can be separated by grinding or etching the rear surface of the plate. Thus, the conductive patterns can be arranged at prescribed positions with no displacement. Particularly, although the bridges have been supported by the adhesive tape, this invention permits them to embedded into the insulating resin without adopting such a supporting means.

Since the insulating resin is formed on the sheet-like conductive foil half-etched, burr generated between the leads can be eliminated.

Where the plate is mainly made of Cu and the conductive film is made of Ni, Ag, Au, or Pd, the conductive film can be used as an etching mask. Further, the half-etching permits the side of the plate to be formed into a warping structure or an eave to be formed on the surface of the conductive pattern, thereby giving the anchor effect. Thus, coming-off or warping of the conductive patterns located on the rear surface of the insulating resin can be prevented.

The semiconductor device manufactured from the plate is composed of a necessary and minimum number of components of a semiconductor element, conductive paths such as conductive patterns and insulating resin so that the semiconductor device can be realized with no useless resource. Thus, the semiconductor device can be realized with reduced cost. By adopting the optimum thickness of each of the covering insulating resin and the conductive foil, a greatly miniaturized, low-profiled and light-weight semiconductor device can be realized.

Further, where the semiconductor element is directly fixed to the die pad through the conductive film of brazing material, Au, Ag, etc., the rear surface of the die pad is exposed. Therefore, the heat generated from the semiconductor element can be directly conducted to the mounting board through the die pad. Particularly, this heat radiating capability permits a power element to be mounted.

The semiconductor device according to this invention has a flat surface on which the rear surface of a separating groove is substantially flush with that of the conductive patterns. Therefore, when a QFP with a small pitch is mounted on the mounting board, the semiconductor device itself can be shifted horizontally as it is. The displacement of the external electrodes can be made very easily.

The semiconductor elements are entirely supported by the entire plate until it is covered with the insulating resin. In the separation of the conductive patterns and their dicing, the insulating resin serves as a supporting board. Therefore, as described in connection with the prior art, the supporting board can be omitted. This reduces the production cost of the semiconductor device.

What is claimed is:

1. A semiconductor device comprising:
    a first and a second semiconductor chip which are electrically connected to each other;
    a first die pad to which said first semiconductor chip is fixed;
    a second die pad to which said second semiconductor chip is fixed;
    at least one bridge electrically connecting said first and said second semiconductor chip;
    external connecting electrodes provided to surround areas where said first and said second semiconductor chip are located, at least a portion of the rear surface of them serving as an electrode to be externally connected;
    first metallic wires which electrically connect said first and said second semiconductor chip to said external connecting electrodes, respectively;
    second metallic wires which electrically connect said first semiconductor chip, said at least one bridge and said second semiconductor chip; and
    insulating resin which seals said first and said second semiconductor chip, said external connecting electrode, and said first and said second metallic wires,
    wherein said insulating resin separates said first and second die pad, said at least one bridge and said external connecting electrodes from one another, and said second metallic wires are coupled to said first and said second semiconductor chip using a ball bond and coupled to said at least one bridge using a stitch bond,
    further comprising a plurality of recesses in a rear surface of said insulating resin, the rear surface of said first and second die pad and said external connecting electrodes being exposed within said recesses, wherein the at least one bridge is exposed within at least one of the recesses;
    wherein a rear surface of the at least one bridge is recessed relative to the rear surface of the insulating resin;
    wherein the rear surface of the at least one bridge is covered by an insulating film; and
    wherein an entire rear surface of the semiconductor device is covered by an insulating film except for a part of the rear surface that is an external connecting electrode.

2. The semiconductor device according to claim 1, wherein said recesses are formed by a portion of the rear surface of said insulating resin of which a back surface protrudes from the rear surface of said first and said second die pad and said external connecting electrodes.

3. The semiconductor device of claim 1 wherein the at least one bridge is arranged between said first and second semiconductor chips.

* * * * *